United States Patent
Lee et al.

(10) Patent No.: US 6,468,924 B2
(45) Date of Patent: Oct. 22, 2002

(54) METHODS OF FORMING THIN FILMS BY ATOMIC LAYER DEPOSITION

(75) Inventors: Seung-hwan Lee, Seoul; Yeong-kwan Kim, Kyungki-do; Dong-chan Kim, Seoul; Young-wook Park, Kyungki-do, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/871,430

(22) Filed: May 31, 2001

(65) Prior Publication Data

US 2002/0068466 A1 Jun. 6, 2002

(30) Foreign Application Priority Data

Dec. 6, 2000 (KR) .............................. 00-73807

(51) Int. Cl.[7] .............................................. H01L 21/31
(52) U.S. Cl. ..................... 438/763; 438/787; 438/791; 438/682; 438/685
(58) Field of Search ................ 438/622, 633, 438/637, 648, 680, 683, 763, 778, 786, 787, 791, 792

(56) References Cited

U.S. PATENT DOCUMENTS

| | | | | |
|---|---|---|---|---|
| 3,933,985 A | * | 1/1976 | Rodgers | 423/350 |
| 4,170,667 A | * | 10/1979 | Rodgers | 427/86 |
| 4,534,840 A | * | 8/1985 | Shindo et al. | 204/192 R |
| 4,542,004 A | * | 9/1985 | Sarma et al. | 423/342 |
| 4,836,997 A | * | 6/1989 | Lepage et al. | 423/342 |
| 5,312,774 A | * | 5/1994 | Nakamura et al. | 437/192 |
| 5,377,429 A | * | 1/1995 | Sandhu et al. | 34/586 |
| 5,422,209 A | * | 6/1995 | Ono et al. | 430/57 |
| 5,593,497 A | * | 1/1997 | Matsuyama et al. | 117/90 |
| 5,831,335 A | * | 11/1998 | Miyamoto | 257/757 |
| 5,948,161 A | * | 9/1999 | Kizuki | 117/89 |
| 6,208,033 B1 | * | 3/2001 | Doan et al. | 257/770 |
| 6,391,785 B1 | * | 5/2002 | Satta et al. | 438/704 |

OTHER PUBLICATIONS

Sneh et al. "Atomic layer groth of SiO2 on Si(100) using SiC14 and H20 in a binary reaction sequence" Surface Science 334 (1995), pp. 135–152.*

Yokoyama et al., "Atomic layer controlled deposition of silicon nitride and in situ growth observation by infrared reflection absorption spectroscopy," Applied Surface Science, 112, 1997, pp. 75–81

* cited by examiner

Primary Examiner—Matthew Smith
Assistant Examiner—Renzo N. Rocchegiani
(74) Attorney, Agent, or Firm—Myers Bigel Sibley & Sajovec

(57) ABSTRACT

Methods of forming thin films include forming a first layer comprising a first element that is chemisorbed to a surface of a substrate, by exposing the surface to a first source gas having molecules therein that comprise the first element and a halogen. A step is then performed to expose the first layer to an activated hydrogen gas so that halogens associated with the first layer become bound to hydrogen provided by the activated hydrogen gas. The first layer may then be converted to a thin film comprising the first element and a second element, by exposing a surface of the first layer to a second source gas having molecules therein that comprise the second element.

29 Claims, 5 Drawing Sheets

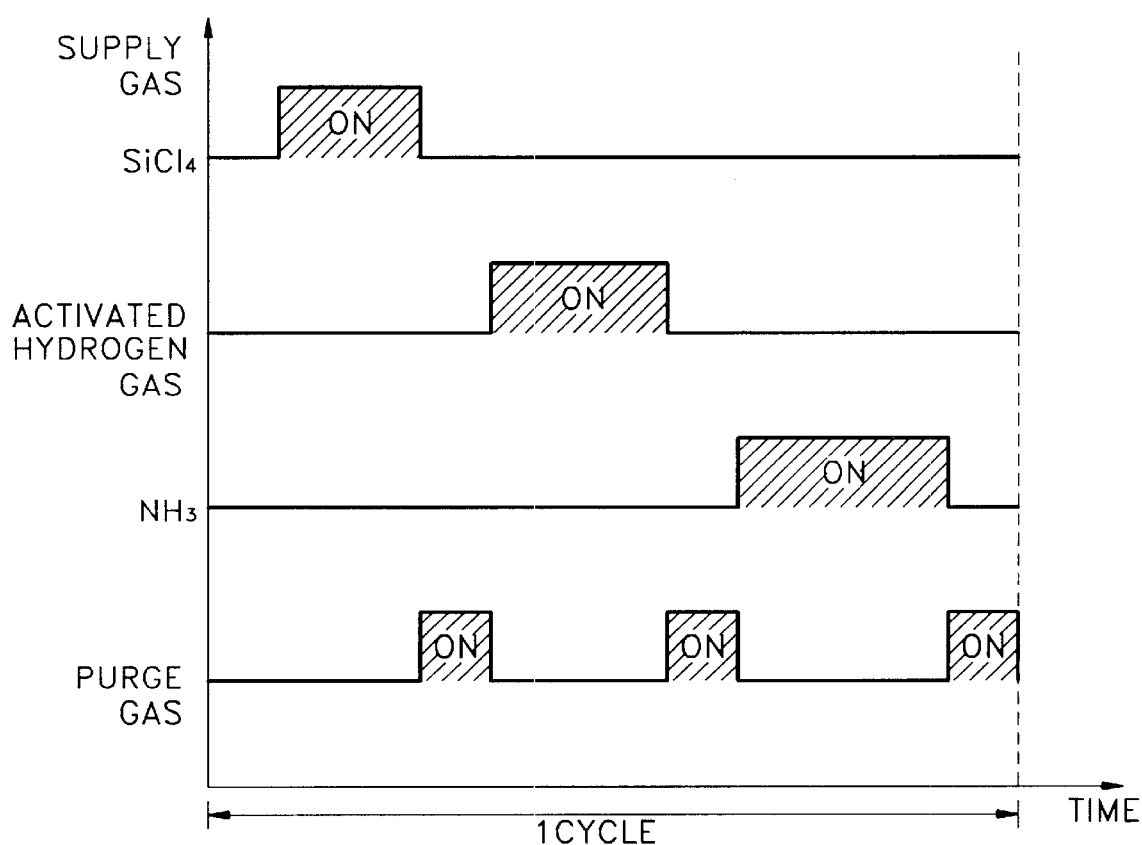

METHODS OF FORMING THIN FILMS BY ATOMIC LAYER DEPOSITION

RELATED APPLICATION

This application claims priority to Korean Application No. 2000-73807, filed Dec. 6, 2000, the disclosure of which is hereby incorporated herein by reference.

1. Field of the Invention

The present invention relates to methods of manufacturing semiconductor devices, and more particularly, to methods of forming thin films on substrates.

2. Background of the Invention

A thin film can be used as a dielectric layer of a semiconductor device, a transparent electrical conductor of a liquid crystal display, and a protective layer of an electroluminescent thin film display, for example. In particular, a thin film used as a dielectric layer of a semiconductor device should have limited impurities or defects therein and at the interface of the film in order to ensure high capacitance and limit leakage current. The step coverage and uniformity of a thin film should also be excellent, particularly when used in semiconductor device applications.

However, it is often difficult to obtain excellent step coverage if a thin film is formed using a conventional chemical vapor deposition (CVD) method or physical vapor deposition (PVD) method. Particularly, in a conventional CVD method, a dielectric layer having relatively good step coverage can be obtained by a deposition process using a surface kinetic mode, but reactants, which are used in depositing a dielectric layer, are typically conveyed to a substrate so that it is often difficult to control step coverage.

In order to overcome the above problems, methods have been proposed for forming thin films that can obtain generally good step coverage on the whole by periodically providing reactants to the surface of the substrate on which a thin film will be formed, and activating surface kinetic areas. These methods are, for example, ALD, cyclic CVD, digital CVD, and advanced CVD. However, if a thin film is formed using these methods, unnecessary atoms contained in a chemical ligand forming reactants may remain within the thin film and become impurities, or create particles on the surface of the substrate. By-products produced in a thin film manufacturing process may have significant influence on generating impurities or particles within the thin film.

In these methods, elements that are used in forming a thin film are typically conveyed to a substrate on which a thin film is formed in a high vapor pressure state. Vapor may also be conveyed to the substrate as a reactant, such as a metalorganic precursor or metal halides. To minimize impurities within a thin film, metal elements, organic ligands and/or halides, which are among the reactants typically conveyed to the substrate, may be removed by decomposition in the CVD method. However, in an ALD method, impurities are frequently removed by chemical exchange. That is, in an ALD method, necessary source gases are typically not mixed within a reaction chamber. Instead, each of the gases typically flows by way of pulsing. For example, if a thin film is formed using a first source gas and a second source gas, the first source gas initially flows into the reaction chamber where it is chemisorbed on the substrate, and then the second source gas flows into the reaction chamber where it is then chemisorbed on the substrate.

An $Si_3N_4$ thin film can be formed using $SiCl_4$ and $NH_3$ in a CVD or ALD method through the following reaction:

$$3SiCl_4 + 4NH_3 \rightarrow Si_3N_4 + 12HCl$$

Here, in the CVD method, $SiCl_4$ and $NH_3$ are sequentially conveyed to a substrate, which is maintained at a temperature of 550° C. or higher, and an $Si_3N_4$ thin film is formed by thermal decomposition and HCl is produced as a by-product. On the other hand, in the ALD method, $SiCl_4$ is chemisorbed on the substrate, which is maintained at a relatively low temperature of about 400° C. and $NH_3$ is conveyed over the result, so that one layer of an $Si_3N_4$ layer is formed by chemical exchange and HCl is produced as a by-product. The HCl by-product may also react with $NH_3$ provided as a reaction gas to form $NH_4Cl$. Accordingly, these deposition processes may require frequent cleaning steps, and may also increase down time in the manufacture of semiconductor devices. By products, such as $NH_4Cl$, may also cause a large quantity of particles to be present during a thin film manufacturing process, and these particles may cause a deterioration in the electric characteristics of the thin film.

SUMMARY OF THE INVENTION

According to a first embodiment of the present invention, a first reactant containing a halogen is provided on a semiconductor substrate in order to chemisorb a first reactant adsorption layer combined with hydrogen on the semiconductor substrate. Activated hydrogen gas is provided to the first reactant adsorption layer in order to remove the halogen from the first reactant adsorption layer. A second reactant is provided to the first reactant adsorption layer from which the halogen is removed in order to chemisorb a second reactant adsorption layer and thereby form a solid thin film. The step of providing activated hydrogen gas may include activating by remote-plasma. The solid thin film can be formed as a monoatomic nitride, a compound nitride, a monoatomic oxide, or a compound oxide.

According to a first aspect of the present invention, a method for forming a thin film further comprises a step of removing by-products from the first reactant adsorption layer before providing the activated hydrogen gas. Also, before providing the second reactant and after providing the activated hydrogen gas, a step of removing by-products may be performed. Purging using an inert gas or pumping can be used for removing the by-products. Furthermore, the step of providing the first reactant, the step of providing the activated hydrogen gas, and the step of providing the second reactant can be sequentially repeated several times until a thin film of a desired thickness is obtained.

In a method for forming a thin film according to a second embodiment of the present invention, silicon source gas containing a halogen is provided on the semiconductor substrate in order to chemisorb a silicon adsorption layer combined with a halogen on the semiconductor substrate. Activated hydrogen gas is provided to the silicon adsorption layer in order to remove the halogen from the silicon adsorption layer. Nitrogen source gas is then provided to the silicon adsorption layer (from which the halogen is removed) to form a silicon nitride layer.

According to a second embodiment of the present invention, a method of forming a thin film includes forming a first layer that comprises a first element and is chemisorbed to a surface of a substrate. The first layer is preferably formed by exposing the surface of the substrate to a first source gas having molecules therein that comprise the first element and a halogen. The first layer is then exposed to an activated hydrogen gas so that halogens associated with the first layer become bound to hydrogen provided by the activated hydrogen gas. The first layer is then converted to a thin film that comprises the first element and a second element, by exposing a surface of the first layer to a second source gas having molecules therein that comprise the second element. The step of exposing the first layer to an activated hydrogen gas may be performed simultaneously with a step of generating the activated hydrogen gas using a plasma generated remote from the substrate. This step may also be preceded by a step of exposing the first layer to an inert gas and may be followed by a step of exposing the first layer to an inert gas.

BRIEF DESCRIPTION OF THE DRAWINGS

FIG. 3 is a timing diagram that illustrates a gas pulsing method when a silicon nitride layer is formed according to an embodiment of the present invention.

DESCRIPTION OF PREFERRED EMBODIMENTS

Figure 1A:
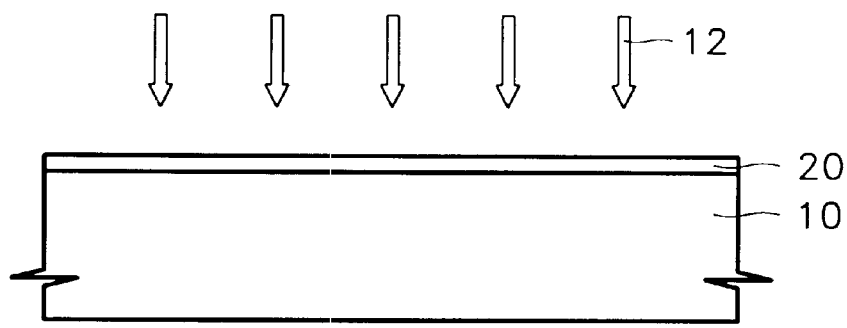
FIGS. 1A through 1F are cross-sectional views illustrating methods of forming thin films according to a preferred embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. However, when a layer or region is described as being "directly on" another layer or region, no intervening layers or regions are present. Like numbers refer to like elements throughout.

FIGS. 1A through 1F are cross-sectional views illustrating a method for forming a thin film by the ALD method, according to a preferred embodiment of the present invention. Referring to FIG. 1A, a first reactant 12 is provided to a substrate 10 as a first source gas in order to form a thin film thereon. The first reactant 12 is typically a halogen, for example, a precursor including a chlorine atom. As a result, a first reactant adsorption layer 20 is chemisorbed on the semiconductor substrate 10.

The first reactant 12 differs according to the kind of thin film which will be formed on the substrate 10. $SiCl_4$, $TiCl_4$, $SiH_2Cl_2$, $Si_2Cl_6$, $TaCl_3$, $AlCl_3$, or $Al(CH_3)_2Cl$ can be provided as the first reactant. For example, if a silicon nitride layer or a silicon oxide layer is to be formed on the semiconductor substrate 10, a silicon source gas, such as $SiCl_4$, $SiH_2Cl_2$, or $Si_2Cl_6$, can be provided as the first reactant 12. If a $Ta_2O_5$ layer is to be formed on the semiconductor substrate 10, $TaCl_3$ may be provided as the first reactant 12. Also, if an $Al_2O_3$ layer is formed on the semiconductor substrate 10, $AlCl_3$ may be provided as the first reactant 12.

Figure 1B:
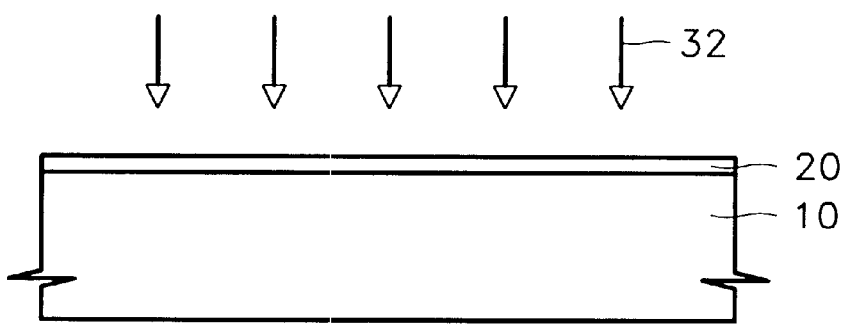

Referring to FIG. 1B, an inert gas 32, such as a nitrogen gas, may be provided as a purge gas to remove by-products remaining on the first reactant adsorption layer 20. To remove by-products, a pumping process can be used instead of a purging process.

Figure 1C:
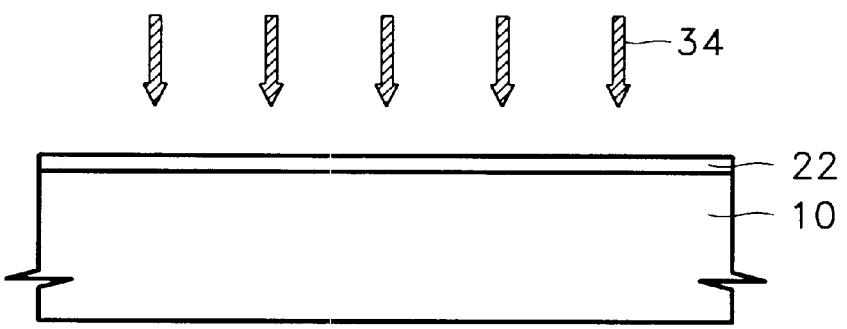

Referring to FIG. 1C, activated hydrogen gas 34 is provided to the first reactant adsorption layer 20. To provide the activated hydrogen gas 34, a step of activating the hydrogen gas provided to the semiconductor substrate 10 by remote-plasma may be performed. As a result, hydrogen provided from the activated hydrogen gas 34 and halogen components within the first reactant adsorption layer 20 react. This reaction causes a removal of halogen from the first reactant adsorption layer 20. Accordingly, the resulting adsorption layer 22, which is at least substantially free of halogen, remains on the semiconductor substrate 10.

Figure 1D:
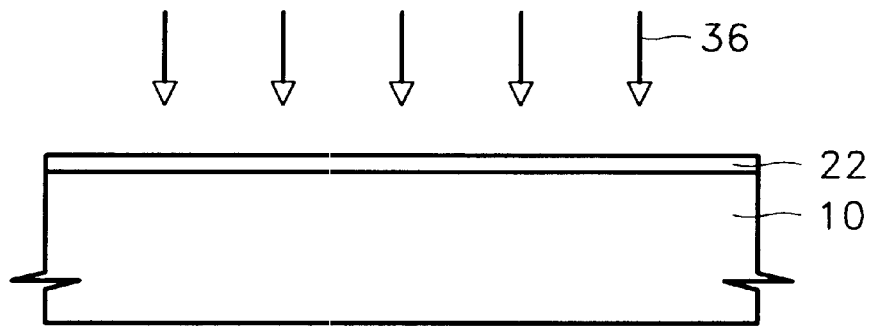

Referring to FIG. 1D, by-products remaining on the adsorption layer 22 may then be removed. By-products may be removed by purging using an inert gas 36 or by using a pumping process, as described above with respect to FIG. 1B.

Figure 1E:
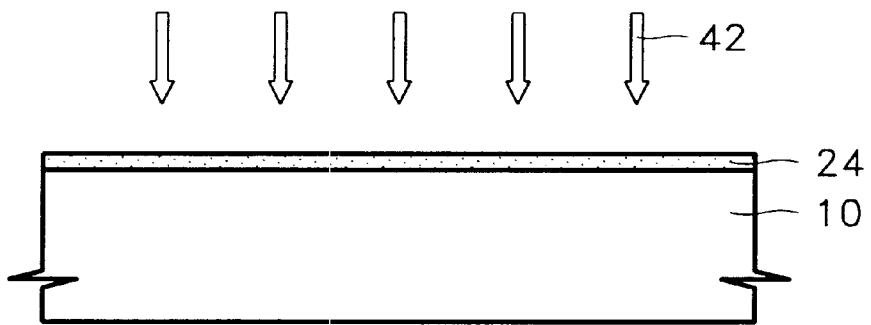

Referring to FIG. 1E, a second reactant 42 is provided to the adsorption layer 22 for forming the thin film. The second reactant 42 can be suitably selected according to the kind of thin film to be formed on the semiconductor substrate 10. For example, if a silicon nitride layer is to be formed on the semiconductor substrate 10, $NH_3$ or $N_2H_4$ can be provided as the second reactant 42. Also, if an oxide layer formed of an oxide such as $Ta_2O_5$ or $Al_2O_3$ is to be formed on the semiconductor substrate 10, an oxygen containing reactant such as $H_2O$ or tetraethylorthosilicate (TEOS) can be provided as the second reactant 42. As a result, an element, which used to form the thin film, among the constituents of the second reactant 42 is chemisorbed on the adsorption layer 22. This preferably results in the formation of a solid thin film 24 comprising a material formed from constituents of the first reactant 12 and the second reactant 42.

Figure 1F:
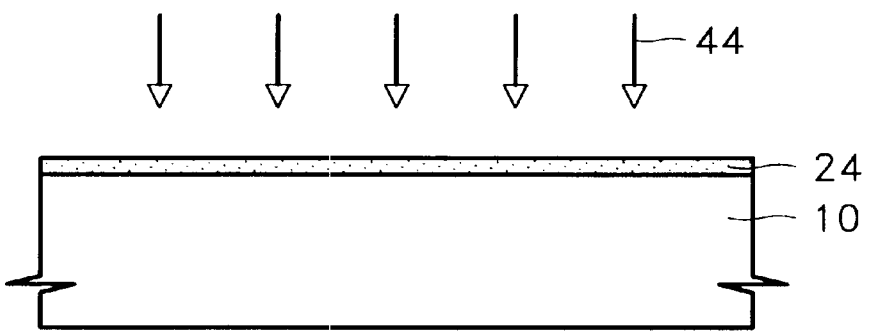

Referring to FIG. 1F, by-products remaining on the solid thin film 24 may then be removed. The by-products, if any, may be removed by purging using an inert gas 44 or by a pumping process, as described above with respect to FIG. 1B.

To achieve a thin film having a desired thickness, the process steps described with reference to FIGS. 1A through 1F may be repeated in sequence several times. Methods according to preferred embodiments of the present invention can be used to form a variety of thin films, including a nitride film such as SiN, TiN, TaN, AlN, a nitride film such as WSiN, TiSiN, TaSiN, AlSiN, AlTiN, an oxide film such as $Al_2O_3$, $TiO_2$, $Ta_2O_5$, $SiO_2$, or an oxide film such as $SrTiO_3$, $PbTiO_3$, $(Ba,Sr)TiO_3$, $Pb(Zr,Ti)O_3$, $(Pb,La)(Zr,Ti)O_3$.

Figure 2A:
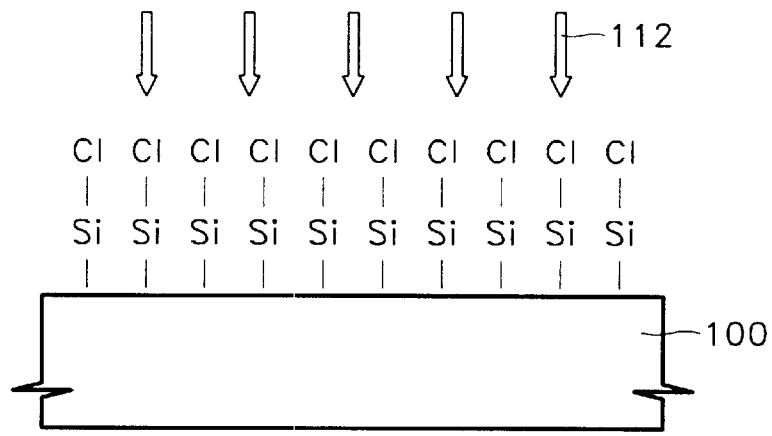
FIGS. 2A through 2F are cross-sectional views illustrating methods of forming silicon nitride layers according to another embodiment of the present invention.
Figure 2B:
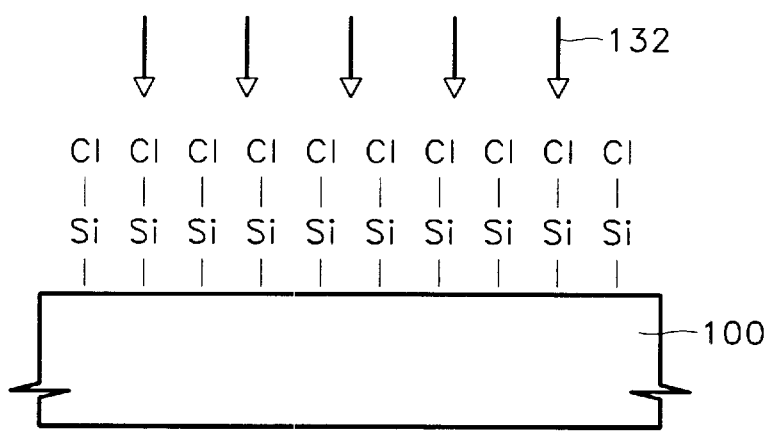

FIGS. 2A through 2F are cross-sectional views illustrating an exemplary method of forming a silicon nitride layer on a semiconductor substrate 100 according to an embodiment of the present invention. Referring to FIG. 2A, after loading the semiconductor substrate 100 into a reaction chamber (not shown), the reaction chamber is maintained at a relatively low temperature of about 450° C., and the chamber pressure is preferably maintained at or lower than 1 torr. In this state, a silicon source gas 112, such as $SiCl_4$, is provided to the semiconductor substrate 100 as a first source gas for about 60 seconds. Here, an adsorption layer containing an Si—Cl bond, in a state where silicon atoms are chemisorbed, is formed on the semiconductor substrate 100. Referring to FIG. 2B, an inert gas such as an $N_2$ gas 132 is exposed to the adsorption layer (including the Si—Cl bond) for about 30 seconds as a purge gas. This exposure to a purge gas may result in a removal of by-products remaining on the semiconductor substrate 100.

Figure 2C:
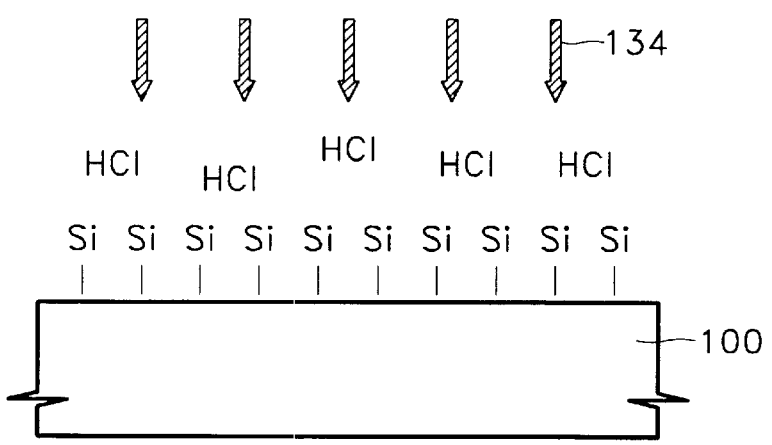
Figure 2D:
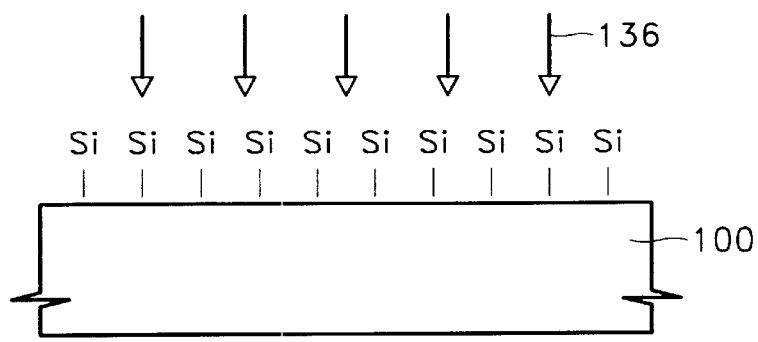

Referring to FIG. 2C, a hydrogen gas 134 activated by a remote-plasma may be provided to the adsorption layer for about 60 seconds. Hydrogen atoms provided from the hydrogen gas 134 react with chlorine atoms attached to the adsorption layer. Forty watts of RF power may be applied to generate the remote-plasma and provide the activated hydrogen gas 134. When exposed to the activated hydrogen gas 134, the chlorine atoms may become separated from the adsorption layer and form HCl, and an adsorption layer comprising silicon atoms may remain on the semiconductor substrate 100. Referring to FIG. 2D, after the activated hydrogen gas 134 has been provided, an inert gas 136 comprising $N_2$ may be provided for about 30 seconds in order to purge contaminants and byproducts from the adsorption layer comprising Si.

Figure 2E:
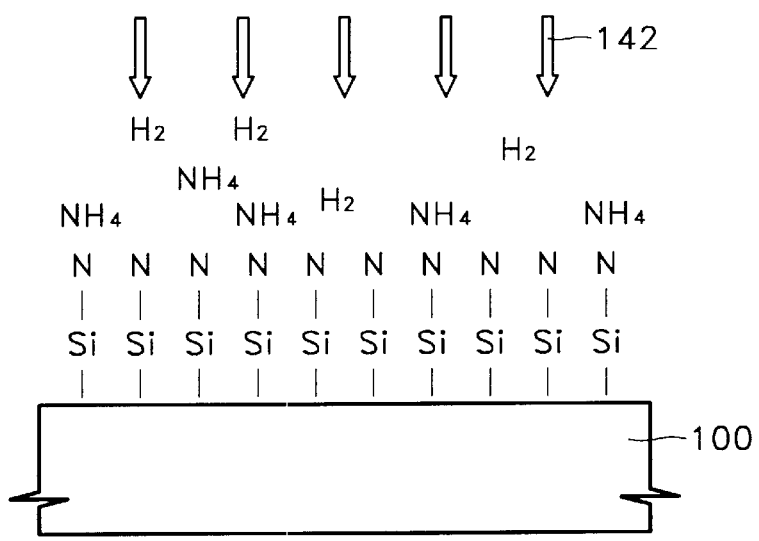
Figure 2F:
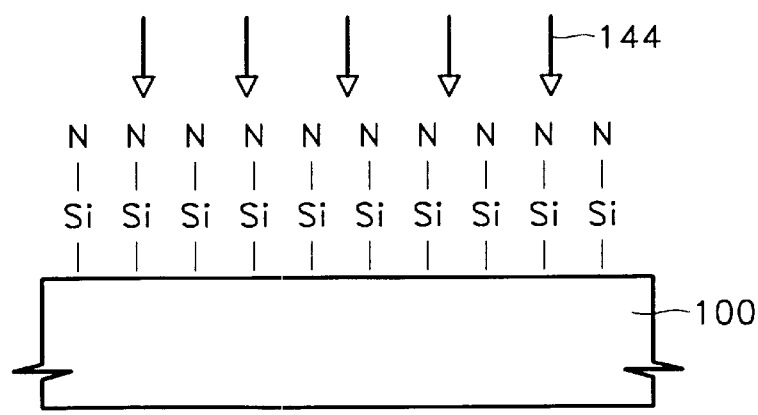

Referring to FIG. 2E, a nitrogen source gas 142, such as an $NH_3$ gas, is provided to the adsorption layer for about 90 seconds as a second source gas. The silicon forming the adsorption layer in FIG. 2D is combined with nitrogen from the nitrogen source gas 142. $N_2H_4$ may also be used as the nitrogen source gas 142. Referring to FIG. 2F, after providing the nitrogen source gas 142, an inert $N_2$ gas 144 may be provided for about 30 seconds as a purge gas to remove by-products remaining on the semiconductor substrate 100.

A gas pulsing method applied to an embodiment of a method of forming a silicon nitride layer as described in FIGS. 2A through 2F as one cycle, is illustrated by FIG. 3. As a result of performing one cycle of the illustrated ALD method of forming a silicon nitride layer, a silicon nitride layer having an Si—N bond structure may be formed to a thickness of about 2 Å on the semiconductor substrate 100. The process described with reference to FIGS. 2A through 2F may be repeated several times, as necessary, so that a high quality silicon nitride layer having generally good step coverage can be obtained. If a silicon nitride layer is formed by the above method, formation of contaminants, such as $NH_4Cl$, may be reduced.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method for forming a thin film comprising:
providing a first reactant containing a halogen on a semiconductor substrate in order to chemisorb a first reactant adsorption layer combined with the halogen on the semiconductor substrate;
providing activated hydrogen gas to the first reactant adsorption layer in order to remove the halogen from the first reactant adsorption layer; and then
providing a second reactant to the first reactant adsorption layer in order to chemisorb the second reactant into the first reactant adsorption layer and define the thin film.

2. The method of claim 1, wherein the halogen is chlorine.

3. The method of claim 1, wherein the first reactant is $SiCl_4$, $TiCl_4$, $SiH_2Cl_2$, $Si_2Cl_6$, $TaCl_3$, $AlCl_3$, or $Al(CH_3)_2Cl$.

4. The method of claim 1, wherein the activated hydrogen gas is generated by a remote-plasma.

5. The method of claim 1, wherein the thin film is a monoatomic nitride, a compound nitride, a monoatomic oxide, or a compound oxide.

6. The method of claim 5, wherein the monoatomic nitride is SiN, TiN, or AlN.

7. The method of claim 5, wherein the compound nitride is WSiN, TiSiN, TaSiN, AlSiN, or AlTiN.

8. The method of claim 5, wherein the monoatomic oxide is $Al_2O_3$, $TiO_2$, $Ta_2O_5$, or $SiO_2$.

9. The method of claim 5, wherein the compound oxide is $SrTiO_3$, $PbTiO_3$, $(Ba,Sr)TiO_3$, $Pb(Zr,Ti)O_3$, or $(Pb,La)(Zr,Ti)O_3$.

10. The method of claim 1, wherein said step of providing activated hydrogen gas is preceded by the step of removing by-products from the first reactant adsorption layer.

11. The method of claim 10, wherein said removing step is performed by exposing the first reaction adsorption layer to an inert gas.

12. The method of claim 1, wherein said step of providing activated hydrogen gas is followed by the step of removing by-products from the first reactant adsorption layer.

13. The method of claim 1, wherein said step of providing a second reactant is followed by the step of removing by-products from the thin film.

14. The method of claim 1, wherein each of said providing steps is performed in sequence multiple times.

15. A method for forming a thin film comprising the steps of:
providing a silicon source gas containing a halogen to a semiconductor substrate in order to chemisorb a silicon adsorption layer combined with the halogen on the semiconductor substrate;
providing activated hydrogen gas to the silicon adsorption layer in order to remove the halogen from the silicon adsorption layer; and then providing a nitrogen source gas to the silicon adsorption layer to form a silicon nitride layer.

16. The method of claim 15, wherein the silicon source gas is $SiCl_4$, $SiH_2Cl_2$, or $Si_2Cl_6$.

17. The method of claim 15, wherein said step of providing activated hydrogen gas comprises activating the hydrogen gas by remote-plasma.

18. The method of claim 15, wherein the nitrogen source gas is $NH_3$ or $N_2H_4$.

19. The method of claim 15, wherein said step of providing activated hydrogen is preceded by the step of removing by-products from the silicon adsorption layer.

20. The method of claim 15, wherein said step of providing a silicon source gas is followed by the step of exposing the silicon adsorption layer to an inert gas.

21. The method of claim 20, wherein said step of providing activated hydrogen gas is followed by the step of exposing the silicon adsorption layer to an inert gas after the silicon adsorption layer has been exposed to the activated hydrogen gas.

22. A method of forming a film, comprising the steps of:
forming a first layer that comprises a first element and is chemisorbed to a surface of a substrate, by exposing the surface to a first source gas having molecules therein that comprise the first element and a halogen; then
exposing the first layer to an activated hydrogen gas so that halogens associated with the first layer become bound to hydrogen provided by the activated hydrogen gas; and then
converting the first layer to a thin film comprising the first element and a second element, by exposing a surface of the first layer to a second source gas having molecules therein that comprise the second element.

23. A thin film formed by the method of claim 22.

24. The method of claim 22, wherein said exposing step is performed simultaneously with a step of generating the activated hydrogen gas using a plasma generated remote from the substrate.

25. The method of claim 22, wherein said exposing step is preceded by a step of exposing the first layer to an inert gas.

26. The method of claim 25, wherein said exposing step is followed by a step of exposing the first layer to an inert gas.

27. The method of claim 26, wherein the first and second elements are silicon and nitrogen, respectively.

28. A thin film formed by the method of claim 27.

29. The method of claim 22, wherein the first and second elements are silicon and nitrogen, respectively.

* * * * *